(12) United States Patent
Chen et al.

(10) Patent No.: US 10,797,826 B2
(45) Date of Patent: Oct. 6, 2020

(54) POLAR ENCODING AND RATE MATCHING METHOD, APPARATUS, AND DEVICE

(71) Applicant: HUAWEI TECHNOLOGIES CO., LTD., Shenzhen, Guangdong (CN)

(72) Inventors: Ying Chen, Hangzhou (CN); Hejia Luo, Hangzhou (CN); Rong Li, Hangzhou (CN); Bin Li, Shenzhen (CN)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 39 days.

(21) Appl. No.: 16/186,437

(22) Filed: Nov. 9, 2018

(65) Prior Publication Data
US 2019/0081735 A1 Mar. 14, 2019

Related U.S. Application Data

(63) Continuation of application No. PCT/CN2017/078313, filed on Mar. 27, 2017.

(30) Foreign Application Priority Data

May 12, 2016 (CN) .......................... 2016 1 0319645

(51) Int. Cl.
*H04L 1/00* (2006.01)
*H03M 13/13* (2006.01)
*H03M 13/00* (2006.01)

(52) U.S. Cl.
CPC .......... *H04L 1/0068* (2013.01); *H03M 13/13* (2013.01); *H03M 13/616* (2013.01); *H03M 13/6362* (2013.01); *H04L 1/00* (2013.01)

(58) Field of Classification Search
CPC ....... H04L 1/0068; H04L 1/00; H04L 1/0013; H03M 13/6362; H03M 13/616; H03M 13/13
See application file for complete search history.

(56) References Cited

U.S. PATENT DOCUMENTS

2009/0086839 A1\* 4/2009 Xu .................. H03M 13/19
375/262
2014/0173376 A1 6/2014 Jeong et al.
(Continued)

FOREIGN PATENT DOCUMENTS

| CN | 103414540 A | 11/2013 |
| CN | 103684477 A | 3/2014 |

(Continued)

OTHER PUBLICATIONS

3GPP TS 36.212 V13.1.0 (Mar. 2016),3rd Generation Partnership Project;Technical Specification Group Radio Access Network;Evolved Universal Terrestrial Radio Access (E-UTRA);Multiplexing and channel coding(Release 13),total 129 pages.

(Continued)

*Primary Examiner* — Thien Nguyen
(74) *Attorney, Agent, or Firm* — Womble Bond Dickinson (US) LLP

(57) ABSTRACT

A polar encoding and rate matching method is provided, including: determining one or more to-be-deleted rows of a generator matrix, where the generator matrix is determined based on a preset mother code length, and a column in which 1 in the one or more to-be-deleted rows is located includes at least one column with a column weight being 1; deleting, from the one or more to-be-deleted rows, a row corresponding to a polarized channel with lowest reliability, and deleting, from a column in which 1 in the row is located, a column with a column weight being 1, to obtain an after-deletion generator matrix; using the after-deletion generator matrix as a generator matrix to repeat the foregoing steps, until an order of a final generator matrix is equal to a target code length; and performing encoding and rate matching on a to-be-encoded bit based on the final generator matrix.

15 Claims, 7 Drawing Sheets

(56) References Cited

U.S. PATENT DOCUMENTS

| | | | |
|---|---|---|---|
| 2015/0194987 A1 | 7/2015 | Li et al. | |
| 2016/0182187 A1* | 6/2016 | Kim .................. | H03M 13/09 |
| | | | 714/807 |
| 2016/0352464 A1 | 12/2016 | Shen et al. | |
| 2018/0026663 A1* | 1/2018 | Wu .................. | H03M 13/6362 |
| | | | 714/776 |
| 2020/0021315 A1* | 1/2020 | Chen .................. | H03M 13/13 |

FOREIGN PATENT DOCUMENTS

| | | |
|---|---|---|
| CN | 104918063 A | 9/2015 |
| CN | 105164959 A | 12/2015 |
| EP | 2849377 A1 | 3/2015 |
| WO | 2015026148 A1 | 2/2015 |
| WO | 2015143593 A1 | 10/2015 |

OTHER PUBLICATIONS

Runxin Wang et al.,"A Novel Puncturing Scheme for Polar Codes",IEEE Communications Letters, vol. 18, No. 12, Dec. 2014,total 4 pages.

* cited by examiner

| $I_{TBS}$ | \multicolumn{8}{c}{$N=2^n$ ($n = 6,7,8,9,10,11,12,13$)} |
|---|---|---|---|---|---|---|---|---|
| | 64 | 128 | 256 | 512 | 1024 | 2048 | 4096 | 8192 |
| 0 | 16 | 20 | 26 | 36 | 82 | 184 | 410 | 902 |
| 1 | 18 | 24 | 34 | 62 | 136 | 294 | 628 | 1338 |
| 2 | 19 | 28 | 44 | 90 | 192 | 402 | 846 | 1774 |
| 3 | 20 | 32 | 56 | 118 | 246 | 512 | 1066 | 2212 |
| 4 | 22 | 36 | 70 | 144 | 300 | 622 | 1284 | 2648 |
| 5 | 23 | 40 | 84 | 172 | 354 | 730 | 1502 | 3086 |
| 6 | 24 | 46 | 98 | 199 | 410 | 840 | 1720 | 3522 |
| 7 | 26 | 52 | 112 | 226 | 464 | 948 | 1938 | 3960 |
| 8 | 27 | 56 | 124 | 254 | 518 | 1058 | 2158 | 4396 |
| 9 | 28 | 60 | 138 | 282 | 573 | 1168 | 2376 | 4834 |
| 10 | 30 | 64 | 152 | 308 | 628 | 1276 | 2594 | 5270 |
| 11 | 31 | 70 | 166 | 336 | 682 | 1386 | 2812 | 5708 |
| 12 | 32 | 76 | 180 | 364 | 738 | 1495 | 3032 | 6144 |
| 13 | 34 | 84 | 192 | 390 | 792 | 1604 | 3250 | 6580 |
| 14 | 36 | 92 | 206 | 418 | 846 | 1714 | 3468 | 7018 |
| 15 | 38 | 100 | 220 | 444 | 902 | 1822 | 3686 | 7454 |

Relative position in a reliability sequence

| 1 | 3 | 5 | 4 | 2 | 7 | | 125 | 128 | 127 |
| 1 | 2 | 3 | 4 | 5 | 6 | | 126 | 127 | 128 |

Reliability increases →

FIG. 5

POLAR ENCODING AND RATE MATCHING METHOD, APPARATUS, AND DEVICE

CROSS-REFERENCE TO RELATED APPLICATIONS

This application is a continuation of International Application No. PCT/CN2017/078313, filed on Mar. 27, 2017, which claims priority to China Patent Application No. 201610319645.0, filed on May 12, 2016, The disclosures of the aforementioned applications are hereby incorporated by reference in their entirety.

TECHNICAL FIELD

Embodiments of the present application relate to wireless communications technologies, and in particular, to a polar encoding and rate matching method, apparatus, and device.

BACKGROUND

With development of wireless communications, an Internet of Things (IoT) communications system presents some new characteristics, such as high reliability, low complexity, and wide coverage.

An existing mainstream code, for example, a Turbo code and a low-density parity-check (LDPC for short) code, cannot meet a requirement of the IoT communications system well. In a performance aspect, the Turbo code and the LDPC code can approach the Shannon limit as a code length increases; however, due to encoding and decoding characteristics of the Turbo code and the LDPC code, it is quite difficult for the Turbo code and the LDPC code with limited code lengths to achieve ideal performance. During implementation, encoding/decoding implementation processes of the Turbo code and the LDPC code have relatively high complexity. Therefore, in the IoT communications system, a new encoding technology is urgently needed to resolve a prior-art issue regarding a short packet, reliability, and complexity.

Recently, a polar code is the first and the only known channel encoding method that can strictly provably "reach" the Shannon limit. A brief description of polar encoding and decoding is as follows:

The polar code is a linear code. A generator matrix (or an encoding matrix) of the polar code is set to $G_N$ and an encoding process of the polar code is $x_1^N = u_1^N G_N$. $u_1^N = (u_1, u_2, K, u_N)$ is a to-be-encoded bit with a length of N, and N is a positive integer greater than 1. $G_N$ is an N×N matrix and $G_N = B_N F_2^{\otimes(log_2(N))}$, where $$F_2 = \begin{bmatrix} 1 & 0 \\ 1 & 1 \end{bmatrix},$$

$B_N$ is an N×N transposed matrix, for example, a bit reversal matrix; and $F_2^{\otimes(log_2(N))}$ is a Kronecker product of $log_2 N$ $F_2$s. The foregoing addition and multiplication operations are all addition and multiplication operations in a binary Galois field.

A most basic polar decoding method is successive cancellation (SC for short) decoding, and a subsequently proposed SC-list decoding algorithm improves short code decoding performance by using horizontal path extension and a cyclic redundancy check (CRC for short) selection method.

From a polar encoding principle, it can be learned that a characteristic of the polar code is that a code length of the polar code is an integral power of 2. However, in actual communication, the code length needs to be flexibly configured according to an actual requirement (such as a requirement of a modulation and coding scheme). Therefore, a rate matching technology is needed to achieve a flexible and changeable code length.

A type of polar-code rate matching solution is to concatenate the polar code with another linear block code, and use the polar code as an inner code to implement encoding for any code length. In this type of solution, two different types of encoders and two different types of decoders are required for encoding and decoding, respectively. This increases implementation complexity and costs.

Another type of polar-code rate matching solution is to find an optimal or suboptimal puncturing manner by using an exhaust algorithm or a greedy algorithm, so as to reduce impact of rate matching on the polar code performance. In the exhaust algorithm, each possible puncturing manner needs to be traversed, reliability of an information bit corresponding to the puncturing manner is calculated, and a to-be-punctured bit is determined based on a reliability level. A disadvantage of this type of solution is excessively high complexity. If the greedy algorithm is used, only a puncturing manner that has minimum impact on the reliability of an information bit may be selected. With the greedy algorithm, a specific calculation amount may be reduced, but complexity of the algorithm is still relatively high.

SUMMARY

Disclosed embodiments of the present application provide a polar encoding and rate matching method, apparatus, and device, to implement joint encoding and rate matching, thereby greatly reducing calculation complexity.

According to a first aspect, an embodiment of the present application provides a polar encoding and rate matching method, including:

determining one or more to-be-deleted rows of a generator matrix, where the generator matrix is determined based on a preset mother code length, and a column in which 1 in the one or more to-be-deleted rows is located includes at least one column with a column weight being 1;

deleting, from the one or more to-be-deleted rows, a row corresponding to a polarized channel with lowest reliability, and deleting, from a column in which 1 in the row is located, a column with a column weight being 1, to obtain an after-deletion generator matrix;

using the after-deletion generator matrix as a generator matrix to repeat the foregoing steps, until an order of a final generator matrix is equal to a target code length; and performing encoding and rate matching on a to-be-encoded bit based on the final generator matrix.

In the polar encoding and rate matching method provided by this embodiment of the present application, for polar codes with different target code lengths based on a same mother code, it is not required to perform reliability calculation to determine a position of an information bit or a frozen bit. Therefore, repeated calculation of a reliability sequence is not required, and calculation complexity can be greatly reduced.

Specifically, reliability of the one or more to-be-deleted rows is obtained by querying a reliability ranking table, where the reliability ranking table indicates a reliability sequence of different positions, in a to-be-transmitted vector, corresponding to different mother code lengths and different transport block sizes, and the to-be-transmitted vector is a vector with a length equal to the mother code length.

Polar codes with different target code lengths may be encoded based on a reliability sequence corresponding to a same mother code length. In this case, the reliability sequence, corresponding to the same mother code length, based on the different target code lengths may be obtained by querying the table or may be obtained through only one calculation. Therefore, a quantity of stored tables and the calculation complexity can be greatly reduced.

Specifically, the to-be-encoded bit is obtained by placing an information bit and a frozen bit in the to-be-encoded vector based on a reliability sequence, where positions that are corresponding to all columns deleted from the initial generator matrix are puncturing positions, and frozen bits are placed at positions that are corresponding to all rows deleted from the initial generator matrix.

In a one implementation, the performing encoding and rate matching on a to-be-encoded bit based on the final generator matrix includes: deleting, from the to-be-encoded bit, the frozen bit corresponding to all the deleted rows; and encoding, based on the final generator matrix, a to-be-encoded bit obtained after deletion, to obtain an encoded and rate-matched bit.

In another implementation, the performing encoding and rate matching on a to-be-encoded bit based on the final generator matrix includes: encoding the to-be-encoded bit based on a generator matrix determined based on the mother code length; and puncturing an encoded bit based on the puncturing position, to obtain an encoded and rate-matched bit.

In the method provided by this embodiment of the present application, encoding and rate matching may be implemented simultaneously. This reduces calculation complexity and also reduces the quantity of stored tables.

According to a second aspect, an embodiment of the present application provides a polar encoding and rate matching apparatus, including:

a determining module, configured to determine one or more to-be-deleted rows of a generator matrix, where the generator matrix is determined based on a preset mother code length, and a column in which 1 in the one or more to-be-deleted rows is located includes at least one column with a column weight being 1;

a deletion module, configured to delete, from the one or more to-be-deleted rows, a row corresponding to a polarized channel with lowest reliability, and delete, from a column in which 1 in the row is located, a column with a column weight being 1, to obtain an after-deletion generator matrix;

a control module, configured to use the after-deletion generator matrix as a generator matrix and send the generator matrix to the determining module, until an order of a final generator matrix is equal to a target code length; and an encoding and rate matching module, configured to perform encoding and rate matching on a to-be-encoded bit based on the final generator matrix.

In the polar encoding and rate matching apparatus provided by this embodiment of the present application, for polar codes with different target code lengths based on a same mother code, it is not required to perform reliability calculation to determine a position of an information bit or a frozen bit. Therefore, repeated calculation of a reliability sequence is not required, and calculation complexity can be greatly reduced.

Specifically, reliability of the one or more to-be-deleted rows is obtained by querying a reliability ranking table, where the reliability ranking table indicates a reliability sequence of different positions, in a to-be-transmitted vector, corresponding to different mother code lengths and different transport block sizes, and the to-be-transmitted vector is a vector with a length equal to the mother code length.

Polar codes with different target code lengths may be encoded based on a reliability sequence corresponding to a same mother code length. In this case, the reliability sequence, corresponding to the same mother code length, based on the different target code lengths may be obtained by querying the table or may be obtained through only one calculation. Therefore, a quantity of stored tables and the calculation complexity can be greatly reduced.

Specifically, the to-be-encoded bit is obtained by placing an information bit and a frozen bit in a to-be-encoded vector based on a reliability sequence, where positions that are corresponding to all columns deleted from the initial generator matrix are puncturing positions, and frozen bits are placed at positions that are corresponding to all rows deleted from the initial generator matrix.

In one implementation, the encoding and rate matching module includes an encoding submodule and a rate matching submodule; the rate matching submodule is configured to delete, from the to-be-encoded bit, the frozen bit corresponding to all the deleted rows; and the to-be-encoded bit obtained after deletion is encoded based on the final generator matrix, to obtain an encoded and rate-matched bit.

In another implementation, the encoding and rate matching module includes an encoding submodule and a rate matching submodule; the encoding submodule is configured to encode the to-be-encoded bit based on a generator matrix determined based on the mother code length; and the rate matching submodule is configured to puncture an encoded bit based on the puncturing position, to obtain an encoded and rate-matched bit.

In the apparatus provided by this embodiment, encoding and rate matching may be implemented simultaneously. This reduces calculation complexity and also reduces the quantity of stored tables.

According to a third aspect, an embodiment of the present application provides a polar encoding and rate matching device, including: a processor, a memory, and a bus, where the processor and the memory are connected by using the bus, to perform data transmission;

the processor is configured to determine one or more to-be-deleted rows of a generator matrix, where the generator matrix is determined based on a preset mother code length, and a column in which 1 in the one or more to-be-deleted rows is located includes at least one column with a column weight being 1; delete, from the one or more to-be-deleted rows, a row corresponding to a polarized channel with lowest reliability, and delete, from a column in which 1 in the row is located, a column with a column weight being 1, to obtain an after-deletion generator matrix; use the after-deletion generator matrix as a generator matrix to repeat the foregoing steps, until an order of a final generator matrix is equal to a target code length; and perform encoding and rate matching on a to-be-encoded bit based on the final generator matrix; and the memory is configured to store a generator matrix used during a processing process of the processor.

In the polar encoding and rate matching device provided by this embodiment, for polar codes with different target code lengths based on a same mother code, it is not required to perform reliability calculation to determine a position of an information bit or a frozen bit. Therefore, repeated calculation of a reliability sequence is not required, and calculation complexity can be greatly reduced.

Specifically, reliability of the one or more to-be-deleted rows is obtained by querying a reliability ranking table, where the reliability ranking table indicates a reliability sequence of different positions, in a to-be-transmitted vector, corresponding to different mother code lengths and different transport block sizes, and the to-be-transmitted vector is a vector with a length equal to the mother code length.

Polar codes with different target code lengths may be encoded based on a reliability sequence corresponding to a same mother code length. In this case, the reliability sequence, corresponding to the same mother code length, based on the different target code lengths may be obtained by querying the table or may be obtained through only one calculation. Therefore, a quantity of stored tables and the calculation complexity can be greatly reduced.

Specifically, the to-be-encoded bit is obtained by placing an information bit and a frozen bit in a to-be-encoded vector based on a reliability sequence, where positions that are corresponding to all columns deleted from the initial generator matrix are puncturing positions, and frozen bits are placed at positions that are corresponding to all rows deleted from the initial generator matrix.

In a one implementation, the performing encoding and rate matching on a to-be-encoded bit based on the final generator matrix includes:

deleting, from the to-be-encoded bit, the frozen bit corresponding to all the deleted rows; and encoding, based on the final generator matrix, the to-be-encoded bit obtained after deletion, to obtain an encoded and rate-matched bit.

In a one implementation, the performing encoding and rate matching on a to-be-encoded bit based on the final generator matrix includes:

encoding the to-be-encoded bit based on a generator matrix determined based on the mother code length; and puncturing an encoded bit based on the puncturing position, to obtain an encoded and rate-matched bit.

In the embodiments of the present application, the generator matrix is searched for the column with a column weight being 1 and the row in which 1 is located, some or all frozen bits and the puncturing position are determined based on the reliability sequence, and polar encoding and rate matching are performed on the to-be-encoded bit. In the polar encoding and rate matching method provided by the embodiments of the present application, for polar codes with different target code lengths based on a same mother code, it is not required to perform reliability calculation to determine a position of an information bit or a frozen bit. Therefore, repeated calculation of a reliability sequence is not required, and calculation complexity can be greatly reduced.

BRIEF DESCRIPTION OF DRAWINGS

The accompanying drawings in the following description show merely some embodiments of the present application and are exemplary.

FIG. 5 is a schematic diagram of a process in which deletion is performed on a generator matrix by using $G_8$ as an example;

DESCRIPTION OF EMBODIMENTS

The following description describes technical solutions of the embodiments of the present application with reference to the accompanying drawings in the embodiments of the present application. The described embodiments are merely exemplary for the present application.

Figure 1:
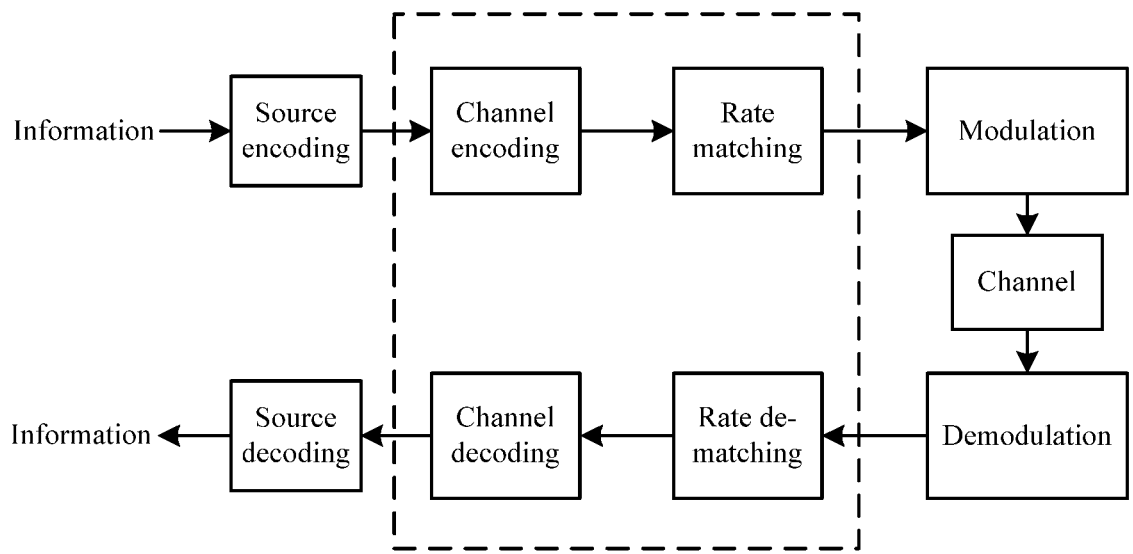
FIG. 1 is a schematic flowchart of a communications system.

FIG. 1 is a schematic flowchart of a communications system. As shown in FIG. 1, during a transmission process, source encoding/decoding, channel encoding/decoding, rate matching/de-matching, and modulation/demodulation need to be performed on information, where channel encoding and rate matching are most important to information transmission reliability in an entire communications system. A polar-code rate matching solution is referred to as quasi-uniform puncturing (QUP for short). A puncturing manner of this solution is very simple. Puncturing is performed on only a mother code of a polar code only in a front-to-back or back-to-front sequence. This solution provides a relatively simple polar-code rate matching solution with relatively good performance. However, reliability of each polarized channel needs to be calculated based on a puncturing manner of the mother code, and a position of an information bit or a frozen bit needs to be determined by using a new reliability sequence.

Figure 2:
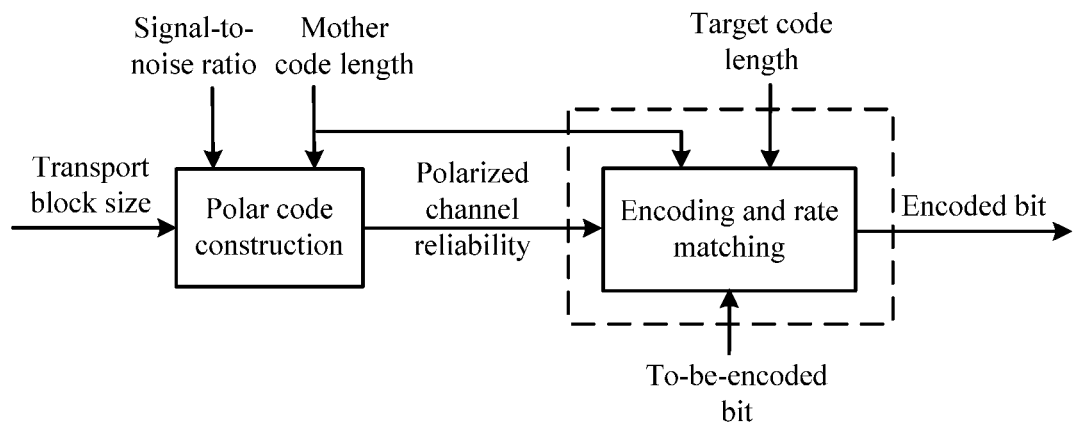
FIG. 2 is a schematic block diagram of a polar encoding and rate matching method according to an embodiment of the present application.

FIG. 2 is a schematic block diagram of a polar encoding and rate matching method according to an embodiment of the present application. As shown in FIG. 2, before polar encoding, a reliability sequence of a polarized channel is determined first based on a transport block size (TBS for short), a mother code length, and channel information of an actual channel. Specifically, the reliability sequence may be obtained by querying a table (a table shown in FIG. 4). The transport block size indicates a quantity of information bits, a mother code may be considered as a code that is encoded but not rate-matched, and the polarized channel is a channel that presents a polarized phenomenon in terms of reliability. Polar encoding and rate matching are performed on a to-be-encoded bit based on the polarized channel reliability, a target code length, and a generator matrix that is determined based on the mother code length. Specifically, the method provided by this embodiment of the present application is used to determine all to-be-deleted columns of the generator matrix based on the polarized channel reliability, a frozen bit is placed at positions, in a to-be-encoded vector, corresponding to 1 in the to-be-deleted columns, an information bit or a frozen bit is placed at a remaining position in a descending order of reliability, to obtain the to-be-encoded bit. The to-be-encoded vector is a vector with a length of N, and the to-be-encoded bit is obtained after the information bit and the frozen bit are placed in the to-be-encoded vector.

Figure 3:
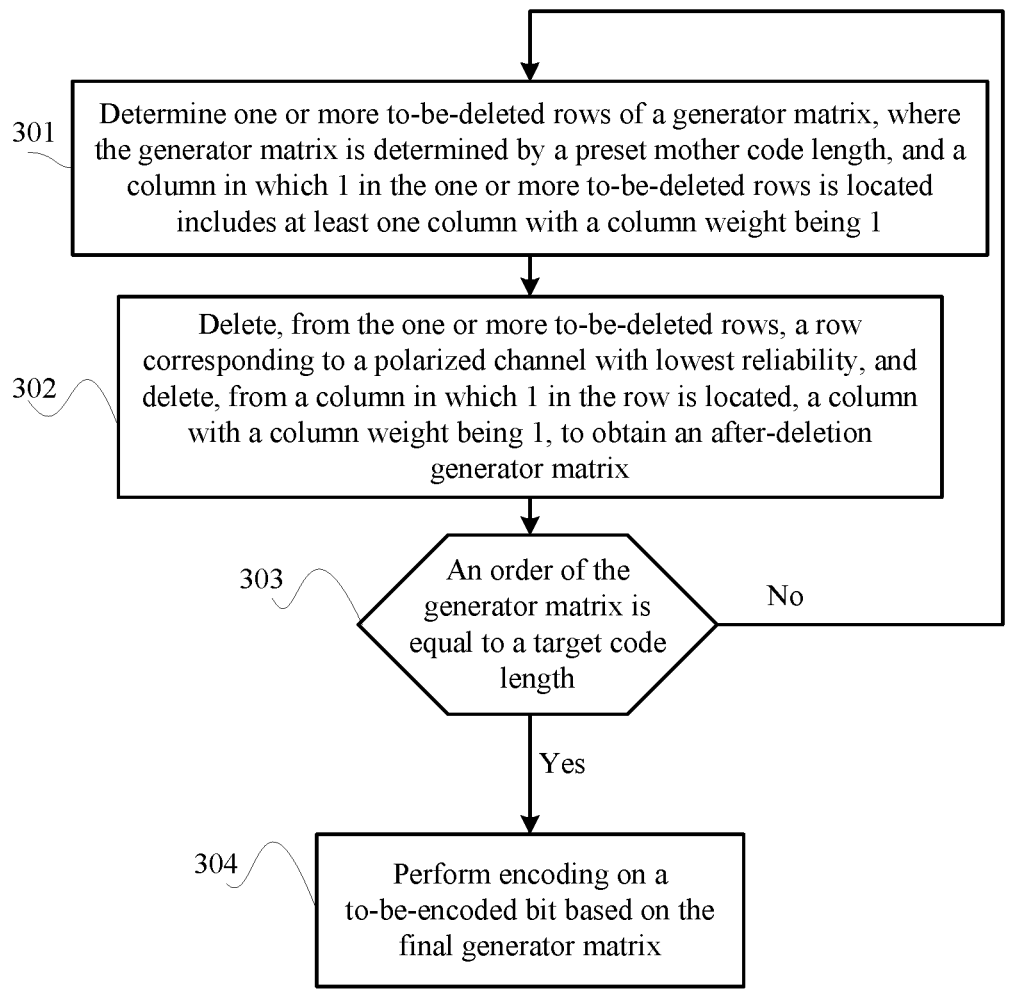
FIG. 3 is a schematic diagram of a polar encoding and rate matching method according to an embodiment of the present application.

FIG. 3 is a schematic diagram of a polar encoding and rate matching method according to an embodiment of the present application, as shown in FIG. 3.

Step 301: Determine one or more to-be-deleted rows of a generator matrix, where the generator matrix is determined based on a preset mother code length, and a column in which 1 in the one or more to-be-deleted rows is located includes at least one column with a column weight being 1.

Specifically, it can be learned from the description of the background that the generator matrix is $G_N = B_N F_2^{\otimes(log_2(N))}$, where N may be considered as the preset mother code length. In actual implementation, the method provided by this embodiment of the present application may also be applied without considering impact of $B_N$. For brevity of description, a preset mother code length of 8 is used as an example and the following generator matrix may be obtained:

$$G_8 = \begin{bmatrix} 1 & 0 & 0 & 0 & 0 & 0 & 0 & 0 \\ 1 & 0 & 0 & 0 & 1 & 0 & 0 & 0 \\ 1 & 0 & 1 & 0 & 0 & 0 & 0 & 0 \\ 1 & 0 & 1 & 0 & 1 & 0 & 1 & 0 \\ 1 & 1 & 0 & 0 & 0 & 0 & 0 & 0 \\ 1 & 1 & 0 & 0 & 1 & 1 & 0 & 0 \\ 1 & 1 & 1 & 1 & 0 & 0 & 0 & 0 \\ 1 & 1 & 1 & 1 & 1 & 1 & 1 & 1 \end{bmatrix}$$

Each row in the generator matrix corresponds to each position of a to-be-encoded vector. For example, a first row of the generator matrix corresponds to a first position of the to-be-encoded vector, a second row of the generator matrix corresponds to a second position of the to-be-encoded vector, and by analogy, a last row of the generator matrix corresponds to a last position of the to-be-encoded vector.

In a to-be-deleted row of the generator matrix, a column in which an element 1 is located includes at least one column with a column weight being 1. In another implementation, all columns with a column weight being 1 in the generator matrix are determined, and then rows in which 1 in the columns with a column weight being 1 is located are determined. These rows are to-be-deleted rows of the generator matrix.

Using $G_8$ as an example, only an eighth column (that is, a last column) of $G_8$ is a column with a column weight being 1, and a to-be-deleted row is an eighth row (that is, a last row).

Step 302: Delete, from the one or more to-be-deleted rows, a row corresponding to a polarized channel with lowest reliability, and delete, from a column in which 1 in the row is located, a column with a column weight being 1, to obtain an after-deletion generator matrix.

Figure 4:
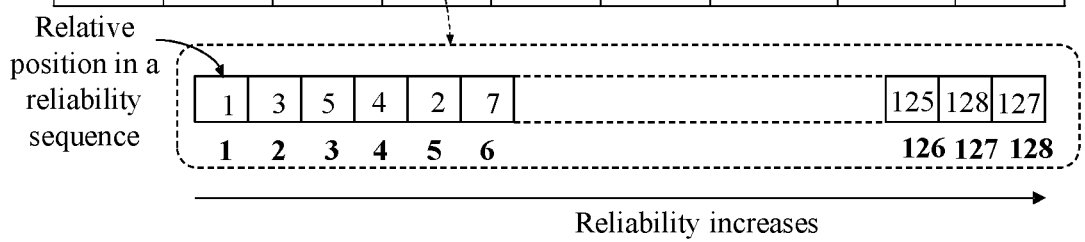
FIG. 4 is a schematic reliability ranking table according to an embodiment of the present application.

The row corresponding to the polarized channel with the lowest reliability in the one or more to-be-deleted rows determined in step 301 is determined based on the one or more to-be-deleted rows and a correspondence between the one or more to-be-deleted rows and a polarized channel. The one or more to-be-deleted rows correspond to one or more positions of a to-be-encoded vector, and the one or more positions of the to-be-encoded vector correspond to polarized channel reliability. In a possible implementation, the row corresponding to the polarized channel with the lowest reliability in the one or more to-be-deleted rows may be determined by querying a table. For example, FIG. 4 shows a schematic reliability ranking table according to an embodiment of the present application. As shown in FIG. 4, $I_{TBS}$ is a transport block size index, where each index value corresponds to a transport block size, and N is a mother code length. In FIG. 4, a value in a column corresponding to each mother code length indicates a quantity of information bits in a mother code with the mother code length. A specific value may be different from that shown in FIG. 4, and may be determined depending on an actual situation or according to a standard. For definite N and $I_{TBS}$, when a channel parameter is fixed, a reliability sequence is definite. The reliability indicates reliability of a corresponding position of a to-be-encoded vector with a length of N. In FIG. 4, for example, N=128 and $I_{TBS}$=8. In this case, a quantity of information bits in a mother code is 56 and a reliability sequence is shown in a lower part of FIG. 4. A value in a block indicates each position of a to-be-encoded vector with a length of 128, and reliability of these positions increases sequentially from left to right. In other words, reliability of a first position of the to-be-encoded vector is lowest, reliability of a third position is higher, and by analogy, reliability of a $127^{th}$ position is highest. Certainly, values in these blocks are merely examples. Specific values may be different from those shown in FIG. 4, and may be determined depending on an actual situation or according to a standard.

The row corresponding to the polarized channel with the lowest reliability is deleted from the one or more to-be-deleted rows, and the column with a column weight being 1 is deleted from the column in which 1 in the row is located. Using $G_8$ as an example, a last row and a last column of $G_8$ are deleted, to obtain after-deletion $G_8$.

Step 303: Use the after-deletion generator matrix as a generator matrix to repeat the foregoing steps, until an order of a final generator matrix is equal to a target code length.

Figure 5:
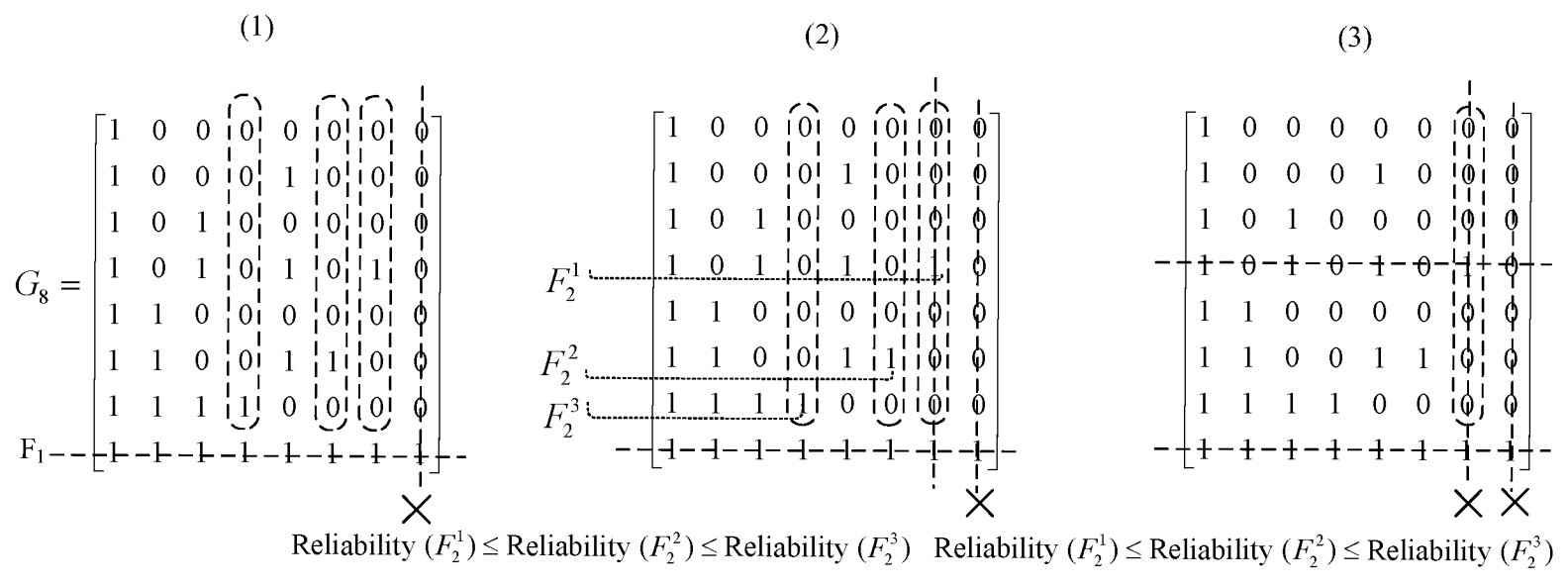

Specifically, the after-deletion generator matrix obtained in step 302 is used as a new initial generator matrix, to repeat step 301 and step 302, until the order of the final generator matrix is equal to the target code length. For example, FIG. 5 is a schematic diagram of a process in which deletion is performed on a generator matrix by using $G_8$ as an example. As shown in (1) of FIG. 5, when step 301 and step 302 are performed for a first time, because there is only one to-be-deleted row that meets a condition and reliability of the to-be-deleted row is $F_1$, a last row and a last column are deleted. As shown in (2) of FIG. 5, for after-deletion $G_8$, when step 301 and step 302 are performed for a second time, three to-be-deleted rows that meet the condition may be obtained. By comparing reliability levels of the three to-be-deleted rows (specifically querying a table similar to that in FIG. 4), it can be learned that reliability corresponding to a fourth row is lowest. 1 in the fourth row exists in a first, a third, a fifth, and a seventh column, and only the seventh column of the four columns has a column weight being 1. Therefore, as shown in (3) of FIG. 5, the fourth row and the seventh column are deleted.

In another implementation, when a quantity of deleted columns of a generator matrix in an entire process is equal to a quantity of punctures required during rate matching, the repetition process described in step 303 may alternatively be terminated. Using $G_8$ as an example, if a target code length is 6 or the quantity of punctures is 2, after-deletion $G_8$ shown in (3) of FIG. 5 is a finally obtained after-deletion generator matrix.

Step 304: Perform encoding and rate matching on a to-be-encoded bit based on the final generator matrix.

Specifically, compared with the initial generator matrix, in the finally obtained generator matrix in step 303, frozen bits are placed at positions that are in the to-be-encoded vector and corresponding to all deleted rows, where the positions of the frozen bits are positions to be punctured when rate matching is performed. An information bit or a frozen bit is placed at a remaining position in a descending order of reliability, to obtain the to-be-encoded bit. The information bit is placed at a position with high reliability.

In a implementation, frozen bits corresponding to all the deleted rows are deleted from the to-be-encoded bit, and a to-be-encoded bit obtained after deletion is encoded based on the final generator matrix, to obtain an encoded and rate-matched bit.

In another implementation, the to-be-encoded bit is encoded based on a generator matrix determined based on the mother code length. Rate matching is performed on the encoded bit based on the determined puncturing position.

Figure 6:
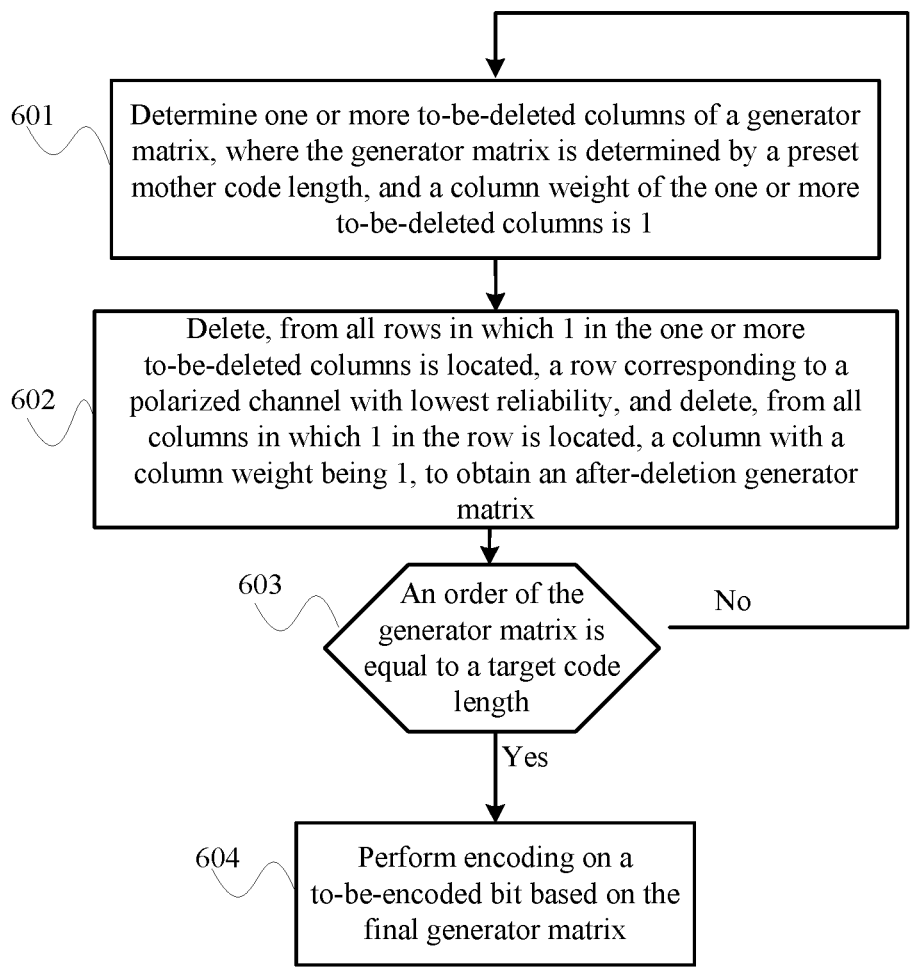
FIG. 6 is a schematic diagram of another polar encoding and rate matching method according to an embodiment of the present application.

FIG. 6 is a schematic diagram of another polar encoding and rate matching method according to an embodiment of the present application, as shown in FIG. 6.

Step 601: Determine one or more to-be-deleted columns of a generator matrix, where the generator matrix is determined based on a preset mother code length, and a column weight of the one or more to-be-deleted columns is 1.

Specifically, all columns with a column weight being 1 may be obtained by querying the generator matrix, and these columns are the to-be-deleted columns.

Step 602: Delete, from all rows in which 1 in the one or more to-be-deleted columns is located, a row corresponding to a polarized channel with lowest reliability, and delete, from all columns in which 1 in the row is located, a column with a column weight being 1, to obtain an after-deletion generator matrix.

A row in the generator matrix in step 601 and step 601 corresponds to a position of a to-be-encoded vector and a polarized channel. Therefore, the row corresponding to the polarized channel with the lowest reliability and in which 1 in the one or more to-be-deleted columns is located may be determined. The after-deletion generator matrix is obtained by deleting the column and a row in which 1 in the column is located.

Step 603: Use the after-deletion generator matrix as a generator matrix to repeat the foregoing steps, until an order of a final generator matrix is equal to a target code length.

Step 604: Perform encoding and rate matching on a to-be-encoded bit based on the final generator matrix.

Step 603 and 604 are the same as the implementation in the embodiment shown in FIG. 3. Details are not repeated herein. In addition, some technical characteristics in step 601 and step 602, for example, the generator matrix, the mother code length, the polarized channel, and the reliability, are the same as or similar to those in the embodiment shown in FIG. 3, and details are not repeated herein.

It can be learned from the embodiments shown in FIG. 3 and FIG. 6, that real-sense deletion for a generator matrix is not necessarily required. A column (and a row) that needs to be deleted from the generator matrix may be recorded, and a position, corresponding to the column (and the row), in a to-be-encoded vector may be determined as positions of some or all frozen bits (and a puncturing position). Specifically, the column (and the row) that needs to be deleted may be recorded by introducing an intermediate variable, or by directly recording positions of some or all frozen bits (and the puncturing position) corresponding to the column (and the row). In other words, in actual implementation, it is only required to determine positions of some or all frozen bits in the to-be-encoded bit and the puncturing position. Encoding and rate matching are performed on the to-be-encoded bit based on an information bit, the frozen bit, the puncturing position, and the generator matrix that are determined, where the to-be-encoded bit may be deemed to be obtained by placing the information bit and the frozen bit in the to-be-encoded vector.

Figure 7:
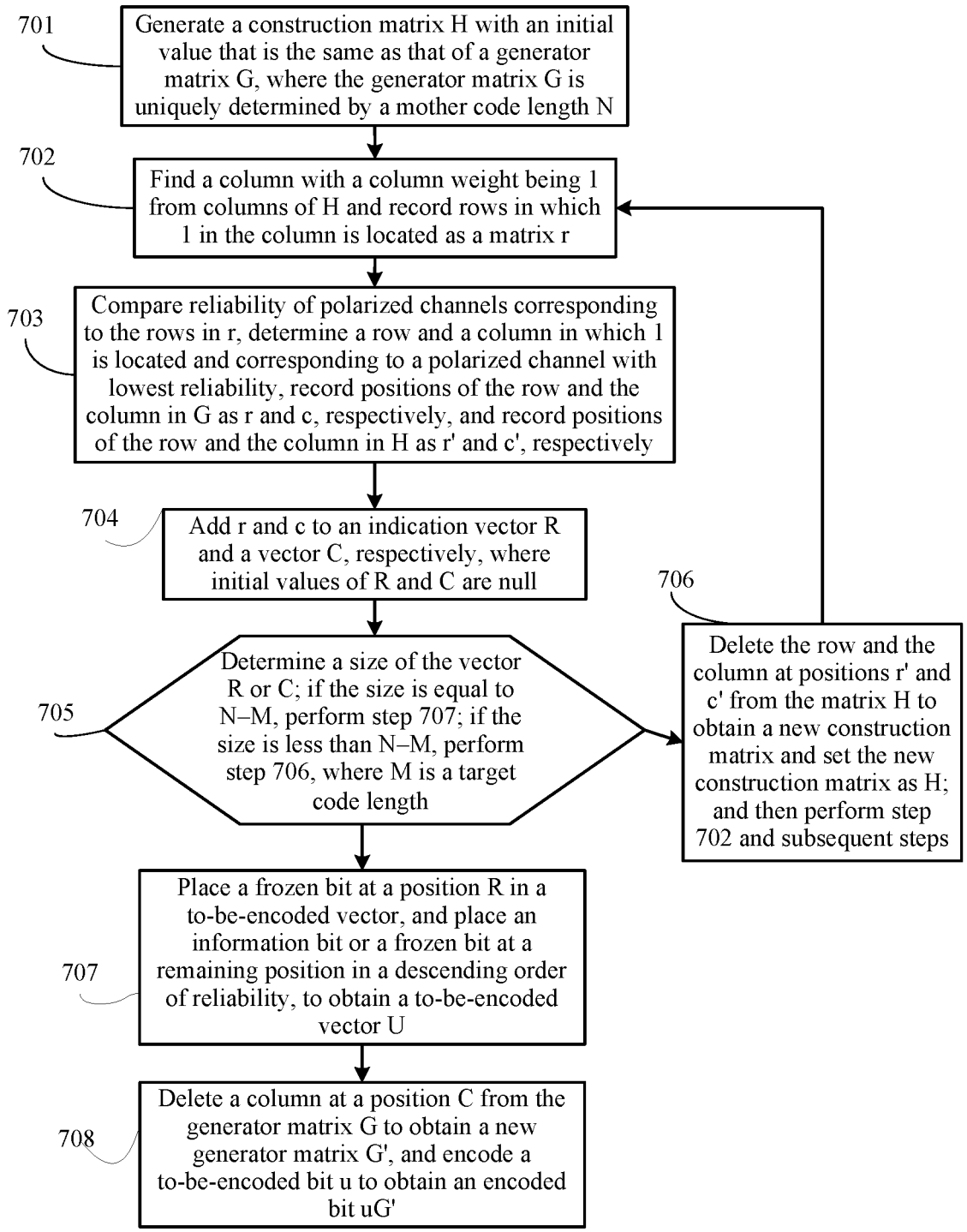
FIG. 7 is a schematic diagram of a polar encoding and rate matching process according to an embodiment of the present application.

FIG. 7 is a schematic diagram of a polar encoding and rate matching process according to an embodiment of the present application, as shown in FIG. 7.

Step 701: Generate a construction matrix H with an initial value that is the same as that of a generator matrix G, where the generator matrix G is uniquely determined based on a mother code length N.

Step 702: Find a column with a column weight being 1 from columns of H and record rows in which 1 in the column is located as a matrix r.

Step 703: Compare reliability of polarized channels corresponding to the rows in r, determine a row and a column in which 1 is located and corresponding to a polarized channel with lowest reliability, record positions of the row and the column in G as r and c, respectively, and record positions of the row and the column in H as r' and c', respectively.

Step 704: Add r and c to an indication vector R and a vector C, respectively, where initial values of R and C are null.

Step 705: Determine a size of the vector R or C; if the size is equal to N–M, perform step 707; if the size is less than N–M, perform step 706, where M is a target code length.

Step 706: Delete the row and the column at positions r' and c' from the matrix H to obtain a new construction matrix and set the new construction matrix as H; and then perform step 702 and subsequent steps.

Step 707: Place a frozen bit at a position R in a to-be-encoded vector, and place an information bit or a frozen bit at a remaining position in a descending order of reliability, to obtain a to-be-encoded vector U.

Step 708: Delete a column at a position C from the generator matrix G to obtain a new generator matrix G', and encode a to-be-encoded bit u to obtain an encoded bit uG'.

Because the column at the position C is deleted from the generator matrix G in step 708, the obtained encoded bit uG' is also a rate-matched bit. In addition, N–M in step 705 may be considered as a quantity of punctures.

Further, from a perspective of determining a puncturing position (or a to-be-punctured frozen bit), an embodiment of the present application provides an implementation, including:

recording, in a set, a row corresponding to a polarized channel with lowest reliability in a generator matrix and a column with a lowest column weight in the generator matrix, and deleting the row and the column to obtain an after-deletion generator matrix;

repeating the foregoing step until a size of the generator matrix is equal to a target code length;

determining all or some frozen bits and puncturing positions in a to-be-encoded bit based on the set; and performing encoding and rate matching on the to-be-encoded bit based on the puncturing positions and the generator matrix.

Further, this embodiment of the present application provides a polar encoding and rate matching method, including:

obtaining, based on a target code length, a target matrix by performing deletion for a generator matrix; and encoding a to-be-encoded bit based on the target matrix, to obtain an encoded and rate-matched bit, where some or all frozen bits in the to-be-encoded bit are in one-to-one correspondence with a row in which 1 in deleted columns is located, where the deleted columns are all columns relative to the target matrix, deleted from the generator matrix.

That some or all frozen bits in the to-be-encoded bit are in one-to-one correspondence with rows in which 1 in deleted columns indicates that to-be-encoded bits corresponding to all rows in which 1 in the deleted columns is located are all frozen bits. Optionally, an information bit or a frozen bit is placed at a remaining position of the to-be-encoded bit in a descending order of reliability, so that the information bit is placed at a position with high reliability.

Conventionally, for different target code lengths, reliability calculation is required, and a sequence of positions indicating information bits in various situations/parameter conditions needs to be stored in a table. In particular, for each target code length, a sequence of positions indicating information bits needs to be stored in the table. In the present application, however, only a reliability ranking table corresponding to one mother code length needs to be stored. Therefore, compared with conventional techniques in which reliability calculation and sequencing need to be performed based on different puncturing modes/code lengths, the disclosed method provided by this embodiment can greatly reduce a quantity of sequences stored in the table. Using LTE as an example, Table 1 is a prior parameter table. A corresponding quantity of sequences that need to be stored in a table is a quantity of possible combinations of all parameters, that is, there are 29×110×3×3×4 combinations. Because actual parameters are not completely enumerated, there may be a larger quantity of actual possible combinations. Table 2 is a parameter table according to the method provided by this embodiment of the present application. Because there are same TBSs in the LTE, a quantity of possible combinations may be less than 29×110×7.

TABLE 1

Prior parameter table

| Parameter type | Typical value |
|---|---|
| Coding and modulation scheme | 0-28 |
| Quantity of resource blocks | 1-110 |
| Cell-specific reference channel port mode | 1, 2, 4 |
| Demodulation reference channel port mode | 0, 4, 8 |
| Quantity of physical downlink control channel symbols | 1, 2, 3, 4* |

TABLE 2

Parameter table in the method provided by one embodiment

| Parameter type | Typical value |
|---|---|
| Transport block size TBs | <29 × 110 |
| Mother code length N | 128, 256, 512, 1024, 2048, 4096, 8192 |

In addition, in the polar encoding and rate matching method provided by the embodiments of the present application, for polar codes with different target code lengths based on a same mother code, it is not required to perform reliability calculation to determine a position of an information bit or a frozen bit. In other words, polar codes with different target code lengths may be encoded based on a reliability sequence corresponding to a same mother code length. In this case, the reliability sequence, corresponding to the same mother code length, based on the different target code lengths may be obtained by querying the table or may be obtained through only one calculation. In other words, a puncturing manner does not affect a reliability sequence. Therefore, repeated calculation of a reliability sequence is not required, and calculation complexity can be greatly reduced.

Figure 8:
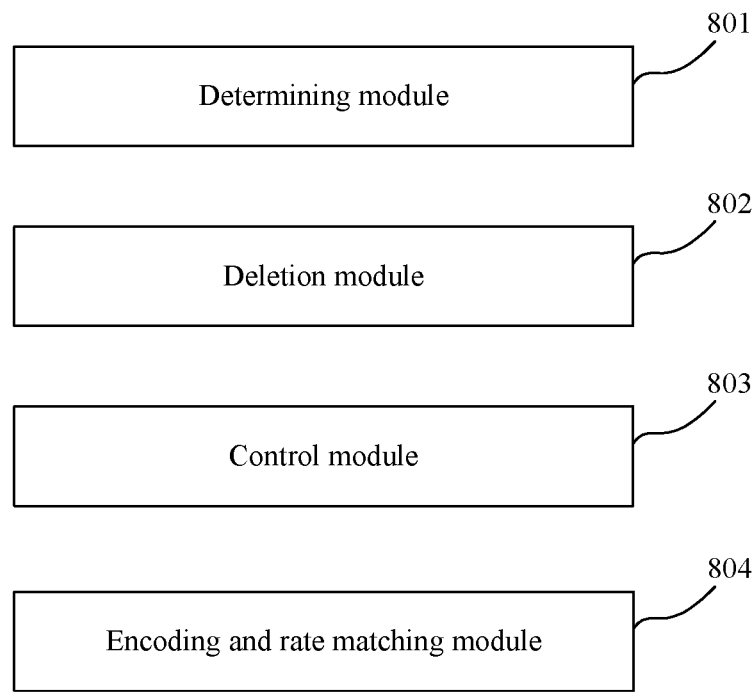
FIG. 8 is a schematic diagram of a polar encoding and rate matching apparatus according to an embodiment of the present application.

An embodiment of the present application further provides an apparatus embodiment for implementing each step and the method in the foregoing method embodiment. FIG. 8 is a schematic diagram of a polar encoding and rate matching apparatus according to an embodiment of the present application. As shown in FIG. 8, the apparatus includes:

a determining module 801, configured to determine one or more to-be-deleted rows of a generator matrix, where the generator matrix is determined based on a preset mother code length, and a column in which 1 in the one or more to-be-deleted rows is located includes at least one column with a column weight being 1;

a deletion module 802, configured to delete, from the one or more to-be-deleted rows, a row corresponding to a polarized channel with lowest reliability, and delete, from a column in which 1 in the row is located, a column with a column weight being 1, to obtain an after-deletion generator matrix;

a control module 803, configured to use the after-deletion generator matrix as a generator matrix and send the generator matrix to the determining module, until an order of a final generator matrix is equal to a target code length; and an encoding and rate matching module 804, configured to perform encoding and rate matching on a to-be-encoded bit based on the final generator matrix.

Some technical characteristics in the polar encoding and rate matching apparatus in the foregoing embodiment, for example, a polarized channel, a frozen bit, a column weight, reliability, and a puncturing position, and another further description (for example, a reliability ranking table) are similar to or corresponding to those in the foregoing method embodiments, and details are not repeatedly described herein.

Figure 9:
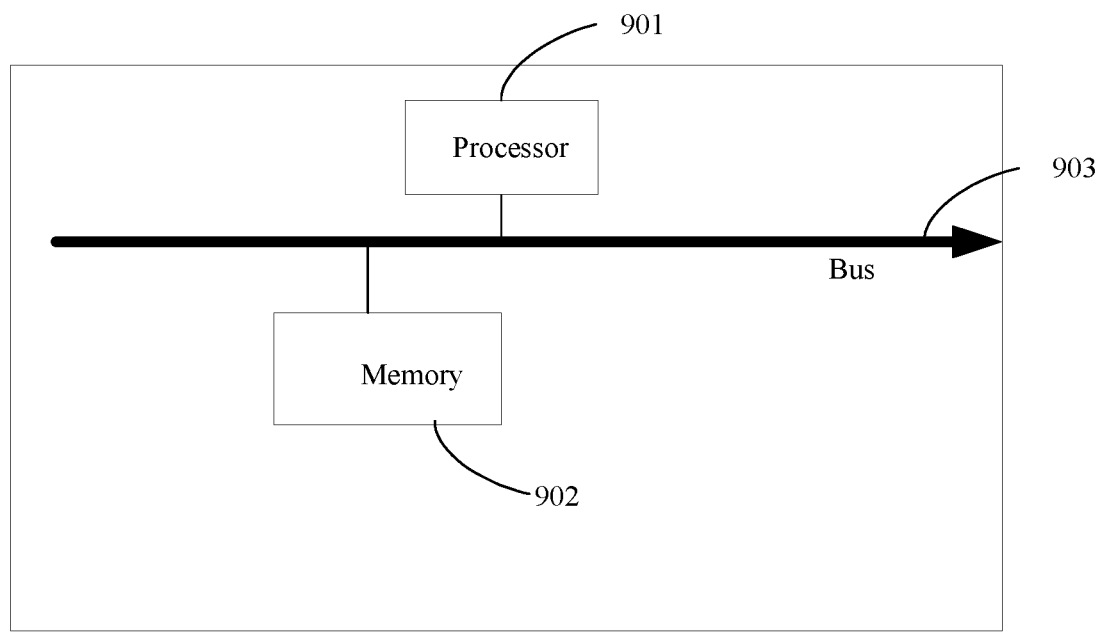
FIG. 9 is a schematic diagram of a polar encoding and rate matching device according to an embodiment of the present application.

FIG. 9 is a schematic diagram of a polar encoding and rate matching device according to an embodiment of the present application. Referring to FIG. 9, the device includes a processor 901, a memory 902, and a bus 903. The processor 901 and the memory 902 are connected by using the bus 903, to perform data transmission. The memory 902 is configured to store data to be processed by the processor 901.

The bus 903 may be an Industry Standard Architecture (ISA) bus, a peripheral component interconnect (PCI) bus, an Extended Industry Standard Architecture (EISA) bus, or the like. This is not limited herein. The bus 903 may be classified into an address bus, a data bus, a control bus, and the like. For ease of representation, the bus is represented by using only one bold line in FIG. 9, which, however, does not mean that there is only one bus or a type of bus.

The memory 902 is configured to store data or executable program code, where the program code includes a computer operation instruction, and may be specifically an operating system, an application program, and the like. The memory 902 may include a high-speed RAM memory, and may further include a non-volatile memory such as at least one disk memory.

The processor 901 may be a central processing unit (CPU for short) or an application-specific integrated circuit (ASIC for short), or may be configured as one or more integrated circuits for implementing this embodiment of the present application.

The processor 901 is configured to implement, by executing program code in the memory 902, the polar encoding and rate matching method according to the foregoing embodiment. Some technical characteristics in the foregoing embodiment, for example, a polarized channel, a frozen bit, a column weight, reliability, and a puncturing position, and another further description (for example, a reliability ranking table) are similar to or corresponding to those in the foregoing method embodiments, and details are not repeatedly described herein.

The present application further provides a non-transitory computer-readable storage medium. When a processor of a network device executes an instruction in the storage medium, the network device can execute any of the foregoing polar encoding and rate matching methods. Some technical characteristics, for example, a polarized channel, a frozen bit, a column weight, reliability, and a puncturing position, and another further description (for example, a reliability ranking table) are similar to or corresponding to those in the foregoing method embodiments, and details are not repeatedly described herein.

With descriptions of the foregoing embodiments, the embodiments may be implemented by hardware, firmware or a combination thereof. When the present embodiments are implemented by software, the foregoing functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a computer. The following provides an example but does not impose a limitation: The computer-readable medium may include a RAM, a ROM, an EEPROM, a CD-ROM, or another optical disc storage or disk storage medium, or another magnetic storage device, or any other medium that can carry or store expected program code in a form of an instruction or a data structure and can be accessed by a computer. In addition, any connection may be appropriately defined as a computer-readable medium. For example, if software is transmitted from a website, a server or another remote source by using a coaxial cable, an optical fiber/cable, a twisted pair, a digital subscriber line (DSL) or wireless technologies such as infrared ray, radio and microwave, the coaxial cable, optical fiber/cable, twisted pair, DSL or wireless technologies such as infrared ray, radio and microwave are included in fixation of a medium to which they belong. For example, a disk (Disk) and disc (disc) used by the present application includes a compact disc CD, a laser disc, an optical disc, a digital versatile disc (DVD), a floppy disk and a Blu-ray disc, where the disk generally copies data by a magnetic means, and the disc copies data optically by a laser means. The foregoing combination should also be included in the protection scope of the computer-readable medium.

In summary, what is described above is merely example embodiments of the technical solutions of the present application, but is not intended to be limiting.

What is claimed is:

1. A method, comprising:
   determining, by a processor, one or more to-be-deleted rows of a generator matrix, wherein the generator matrix is determined based on a preset mother code length, and a column in which 1 in the one or more to-be-deleted rows is located comprises at least one column with a column weight being 1;
   deleting, by the processor from the one or more to-be-deleted rows, a row corresponding to a polarized channel with lowest reliability, and deleting, from a column in which 1 in the row is located, a column with a column weight being 1, to obtain an after-deletion generator matrix;
   using, by the processor, the after-deletion generator matrix as a generator matrix to repeat the foregoing steps, until an order of the generator matrix is equal to a target code length, wherein the generator matrix comprises a final generator matrix when the order of the generator matrix is equal to the target code length and wherein the order of the generator matrix indicates a dimension of the generator matrix; and
   performing, by the processor, encoding and rate matching on a to-be-encoded bit based on the final generator matrix.

2. The method according to claim 1, wherein:
   reliability of the one or more to-be-deleted rows is obtained by querying a reliability ranking table, wherein the reliability ranking table indicates a reliability sequence of different positions, in a to-be-encoded vector, corresponding to different mother code lengths and different transport block sizes, and the to-be-encoded vector is a vector with a length equal to the mother code length.

3. The method according to claim 2, wherein:
   the to-be-encoded bit is obtained by placing an information bit and a frozen bit in the to-be-encoded vector based on a reliability sequence, wherein positions that are corresponding to all columns deleted from an initial generator matrix are puncturing positions, and frozen bits are placed at positions that are corresponding to all rows deleted from the initial generator matrix.

4. The method according to claim 3, wherein the performing encoding and rate matching on a to-be-encoded bit based on the final generator matrix comprises:
   deleting, from the to-be-encoded bit, the frozen bit corresponding to the deleted row; and
   encoding, based on the final generator matrix, the to-be-encoded bit obtained after deletion, to obtain an encoded and rate-matched bit.

5. The method according to claim 3, wherein the performing encoding and rate matching on a to-be-encoded bit based on the final generator matrix comprises:
   encoding the to-be-encoded bit based on a generator matrix determined based on the mother code length; and
   puncturing an encoded bit based on a puncturing position, to obtain an encoded and rate-matched bit.

6. An apparatus, comprising:
   a processor;
   a determining module comprising a first set of instructions to cause the processor to determine one or more to-be-deleted rows of a generator matrix, wherein the generator matrix is determined based on a preset mother code length, and a column in which 1 in the one or more to-be-deleted rows is located comprises at least one column with a column weight being 1;
   a deletion module comprising a second set of instructions to cause the processor to delete, from the one or more to-be-deleted rows, a row corresponding to a polarized channel with lowest reliability, and delete, from a column in which 1 in the row is located, a column with a column weight being 1, to obtain an after-deletion generator matrix;

a control module comprising a third set of instructions to cause the processor to use the after-deletion generator matrix as a generator matrix and send the generator matrix to the determining module, until an order of the generator matrix is equal to a target code length, wherein the generator matrix comprises a final generator matrix when the order of the generator matrix is equal to the target code length and wherein the order of the generator matrix indicates a dimension of the generator matrix; and an encoding and rate matching module comprising a fourth set of instructions to cause the processor to perform encoding and rate matching on a to-be-encoded bit based on the final generator matrix.

7. The apparatus according to claim 6, wherein:

reliability of the one or more to-be-deleted rows is obtained by querying a reliability ranking table, wherein the reliability ranking table indicates a reliability sequence of different positions, in a to-be-encoded vector, corresponding to different mother code lengths and different transport block sizes, and the to-be-encoded vector is a vector with a length equal to the mother code length.

8. The apparatus according to claim 7, wherein:

the to-be-encoded bit is obtained by placing an information bit and a frozen bit in the to-be-encoded vector based on a reliability sequence, wherein positions that are corresponding to all columns deleted from an initial generator matrix are puncturing positions, and frozen bits are placed at positions that are corresponding to all rows deleted from the initial generator matrix.

9. The apparatus according to claim 8, wherein:

the encoding and rate matching module comprises an encoding submodule and a rate matching submodule;

the rate matching submodule is configured to delete, from the to-be-encoded bit, the frozen bit corresponding to the deleted row; and the encoding submodule is configured to encode the to-be-encoded bit obtained after deletion based on the final generator matrix, to obtain an encoded and rate-matched bit.

10. The apparatus according to claim 8, wherein:

the encoding and rate matching module comprises an encoding submodule and a rate matching submodule;

the encoding submodule is configured to encode the to-be-encoded bit based on a generator matrix determined based on the mother code length; and the rate matching submodule is configured to puncture an encoded bit based on a puncturing position, to obtain an encoded and rate-matched bit.

11. A device, comprising: a processor, a memory, and a bus, wherein the processor and the memory are connected by using the bus, to perform data transmission;

the processor is configured to determine one or more to-be-deleted rows of a generator matrix, wherein the generator matrix is determined based on a preset mother code length, and a column in which 1 in the one or more to-be-deleted rows is located comprises at least one column with a column weight being 1; delete, from the one or more to-be-deleted rows, a row corresponding to a polarized channel with lowest reliability, and delete, from a column in which 1 in the row is located, a column with a column weight being 1, to obtain an after-deletion generator matrix; use the after-deletion generator matrix as a generator matrix to repeat the foregoing steps, until an order of the generator matrix is equal to a target code length, wherein the generator matrix comprises a final generator matrix when the order of the generator matrix is equal to the target code length and wherein the order of the generator matrix indicates a dimension of the generator matrix; and perform encoding and rate matching on a to-be-encoded bit based on the final generator matrix; and the memory is configured to store a generator matrix used during a processing process of the processor.

12. The device according to claim 11, wherein:

reliability of the one or more to-be-deleted rows is obtained by querying a reliability ranking table, wherein the reliability ranking table indicates a reliability sequence of different positions, in a to-be-encoded vector, corresponding to different mother code lengths and different transport block sizes, and the to-be-encoded vector is a vector with a length equal to the mother code length.

13. The device according to claim 11, wherein:

the to-be-encoded bit is obtained by placing an information bit and a frozen bit in a to-be-encoded vector based on a reliability sequence, wherein positions that are corresponding to all columns deleted from an initial generator matrix are puncturing positions, and frozen bits are placed at positions that are corresponding to all rows deleted from the initial generator matrix.

14. The device according to claim 13, wherein the performing encoding and rate matching on a to-be-encoded bit based on the final generator matrix comprises:

deleting, from the to-be-encoded bit, the frozen bit corresponding to the deleted row; and encoding, based on the final generator matrix, the to-be-encoded bit obtained after deletion, to obtain an encoded and rate-matched bit.

15. The device according to claim 13, wherein the performing encoding and rate matching on a to-be-encoded bit based on the final generator matrix comprises:

encoding the to-be-encoded bit based on a generator matrix determined based on the mother code length; and puncturing an encoded bit based on a puncturing position, to obtain an encoded and rate-matched bit.

* * * * *